(12) United States Patent
Huang et al.

(10) Patent No.: US 11,538,730 B2
(45) Date of Patent: Dec. 27, 2022

(54) CHIP SCALE PACKAGE STRUCTURE OF HEAT-DISSIPATING TYPE

(71) Applicant: AZUREWAVE TECHNOLOGIES, INC., New Taipei (TW)

(72) Inventors: Hsin-Yeh Huang, Taipei (TW); Chih-Hao Liao, Taipei (TW); Shu-Han Wu, Taipei (TW)

(73) Assignee: AZUREWAVE TECHNOLOGIES, INC., New Taipei (TW)

( * ) Notice: Subject to any disclaimer, the term of this patent is extended or adjusted under 35 U.S.C. 154(b) by 93 days.

(21) Appl. No.: 17/013,864

(22) Filed: Sep. 8, 2020

(65) Prior Publication Data
US 2021/0398872 A1 Dec. 23, 2021

(30) Foreign Application Priority Data
Jun. 19, 2020 (TW) .................................. 109120848

(51) Int. Cl.
*H01L 23/31* (2006.01)
*H01L 23/367* (2006.01)

(52) U.S. Cl.
CPC ........ *H01L 23/367* (2013.01); *H01L 23/3114* (2013.01); *H01L 23/3121* (2013.01)

(58) Field of Classification Search
CPC . H01L 23/367; H01L 23/3114; H01L 23/3121
See application file for complete search history.

(56) References Cited

U.S. PATENT DOCUMENTS

| 6,507,104 | B2 * | 1/2003 | Ho ...................... H01L 23/4334 |
| | | | 257/710 |
| 6,716,676 | B2 * | 4/2004 | Chen ...................... H01L 24/48 |
| | | | 257/E23.092 |
| 6,744,132 | B2 * | 6/2004 | Alcoe ..................... H01L 23/10 |
| | | | 257/710 |
| 6,867,977 | B2 * | 3/2005 | DiStefano ............. H01L 21/563 |
| | | | 361/705 |
| 6,946,729 | B2 * | 9/2005 | Lee ..................... H01L 23/4334 |
| | | | 257/676 |

(Continued)

FOREIGN PATENT DOCUMENTS

TW 201032300 A1 9/2010

*Primary Examiner* — Eugene Lee
(74) *Attorney, Agent, or Firm* — Li & Cai Intellectual Property Office

(57) ABSTRACT

A chip scale package structure of heat-dissipating type is provided and includes a board, a die fixed on and electrically coupled to the board, a thermally conductive adhesive sheet adhered to the die, and a package body formed on the board. The die has a heat-output surface arranged away from the board. The thermally conductive adhesive sheet is connected to at least 50% of an area of the heat-output surface. The package body covers and is connected to the die and entire of the surrounding lateral surface of the thermally conductive adhesive sheet. The die is embedded in the board, the thermally conductive adhesive sheet, and the package body. The heat-dissipating surface of the thermally conductive adhesive sheet is exposed from the package body, and a thermal conductivity of the thermally conductive adhesive sheet is at least 150% of a thermal conductivity of the package body.

10 Claims, 4 Drawing Sheets

(56) References Cited

U.S. PATENT DOCUMENTS

| | | | | |
|---|---|---|---|---|
| 7,015,072 B2* | 3/2006 | Combs | ............... | H01L 23/3128 257/713 |
| 7,202,561 B2* | 4/2007 | Seo | ................... | H01L 23/4334 257/E23.101 |
| 7,411,790 B2* | 8/2008 | Huang | ................ | H01L 23/427 165/104.33 |
| 7,608,915 B2* | 10/2009 | Liao | .................. | H01L 23/4334 257/E23.101 |
| 8,338,938 B2* | 12/2012 | Hsu | .................... | H01L 21/6835 257/692 |
| 8,441,120 B1* | 5/2013 | Arcedera | ............. | H01L 23/433 257/706 |
| 8,704,341 B2* | 4/2014 | Lin | ..................... | H01L 23/552 257/659 |
| 8,970,049 B2* | 3/2015 | Karnezos | ........... | H01L 25/0657 257/E21.705 |
| 9,953,933 B1* | 4/2018 | Cadag | .............. | H01L 23/49811 |
| 11,107,716 B1* | 8/2021 | Sen | .................. | H01L 21/67253 |
| 2003/0085475 A1* | 5/2003 | Im | ......................... | H01L 23/16 257/796 |
| 2004/0036172 A1* | 2/2004 | Azuma | ............. | H01L 23/3128 257/E23.092 |
| 2004/0099944 A1* | 5/2004 | Kimura | ............. | H01L 23/4334 257/E23.092 |
| 2004/0212080 A1* | 10/2004 | Chen | .................. | H01L 23/4334 257/713 |
| 2015/0162216 A1* | 6/2015 | Woychik | .............. | H01L 21/486 438/667 |
| 2016/0329308 A1* | 11/2016 | Co | ..................... | H01L 25/0657 |

\* cited by examiner

CHIP SCALE PACKAGE STRUCTURE OF HEAT-DISSIPATING TYPE

CROSS-REFERENCE TO RELATED PATENT APPLICATION

This application claims the benefit of priority to Taiwan Patent Application No. 109120848, filed on Jun. 19, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a chip scale package structure, and more particularly to a chip scale package structure of a heat-dissipating type.

BACKGROUND OF THE DISCLOSURE

A conventional chip scale package structure includes a package body and a die that is entirely embedded in the package body. For achieving the effect of heat dissipation, the package body of the conventional chip scale package structure can be coated with a heat-dissipating paste, adhered to a heat-dissipating metal sheet, or assembled to a heat-dissipating fan. However, since the operation of the die in the conventional chip scale package structure is becoming faster, it is becoming more difficult for the heat-dissipating configuration applied to the conventional chip scale package structure to meet practical requirements.

SUMMARY OF THE DISCLOSURE

In response to the above-referenced technical inadequacies, the present disclosure provides a chip scale package structure with heat-dissipating type to effectively improve on the issues associated with conventional chip scale package structures.

In one aspect, the present disclosure provides a chip scale package (CSP) structure with heat-dissipating type. The CSP structure includes a board, a die, a thermally conductive adhesive sheet, and a package body. The die is fixed on and electrically coupled to the board. The die has a heat-output surface arranged away from the board. The thermally conductive adhesive sheet is adhered to the heat-output surface of the die and is connected to at least 50% of an area of the heat-output surface. The thermally conductive adhesive sheet has a heat-dissipating surface arranged away from the die and a surrounding lateral surface that is connected to a peripheral edge of the heat-dissipating surface. The package body is formed on the board. The package body covers and is connected to the die and entire of the surrounding lateral surface of the thermally conductive adhesive sheet. The die is embedded in the board, the thermally conductive adhesive sheet, and the package body. The heat-dissipating surface of the thermally conductive adhesive sheet is exposed from the package body, and a thermal conductivity of the thermally conductive adhesive sheet is at least 150% of a thermal conductivity of the package body.

Therefore, any heat energy generated from the die of the present disclosure can be directly transmitted to the thermally conductive adhesive sheet by using the thermally conductive adhesive sheet to adhere to the heat-output surface of the die, so that the heat-dissipating efficiency of the CSP structure of the present disclosure can be effectively increased, and the heat-dissipating configuration of the CSP structure of the present disclosure can be different from that of the conventional CSP structure.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
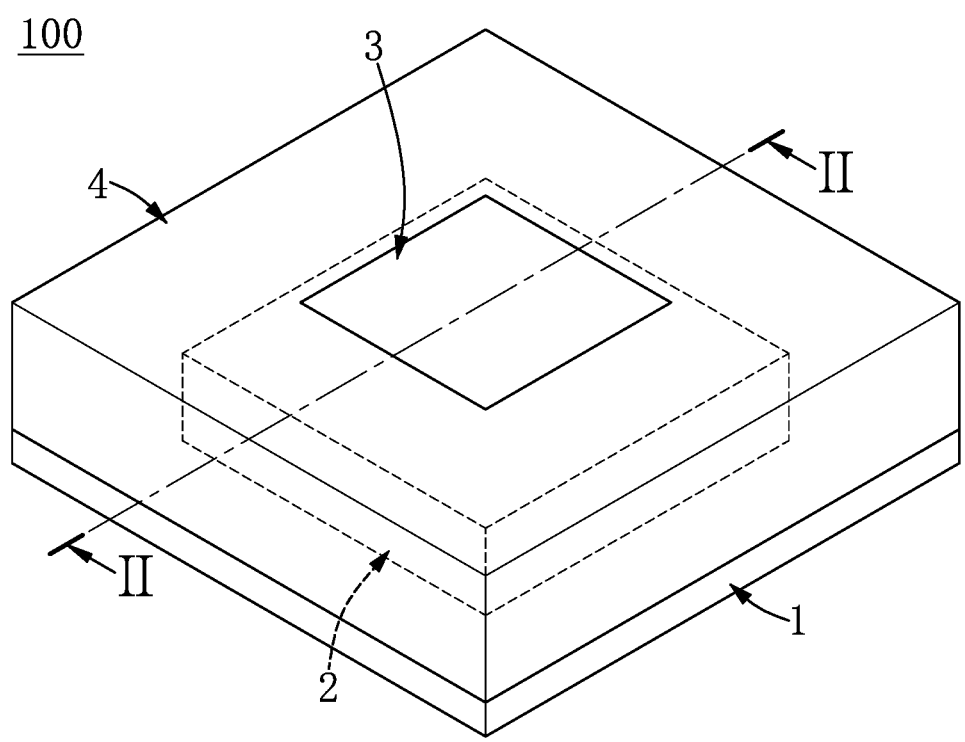
FIG. 1 is a perspective view of a chip scale package structure with heat-dissipating type according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
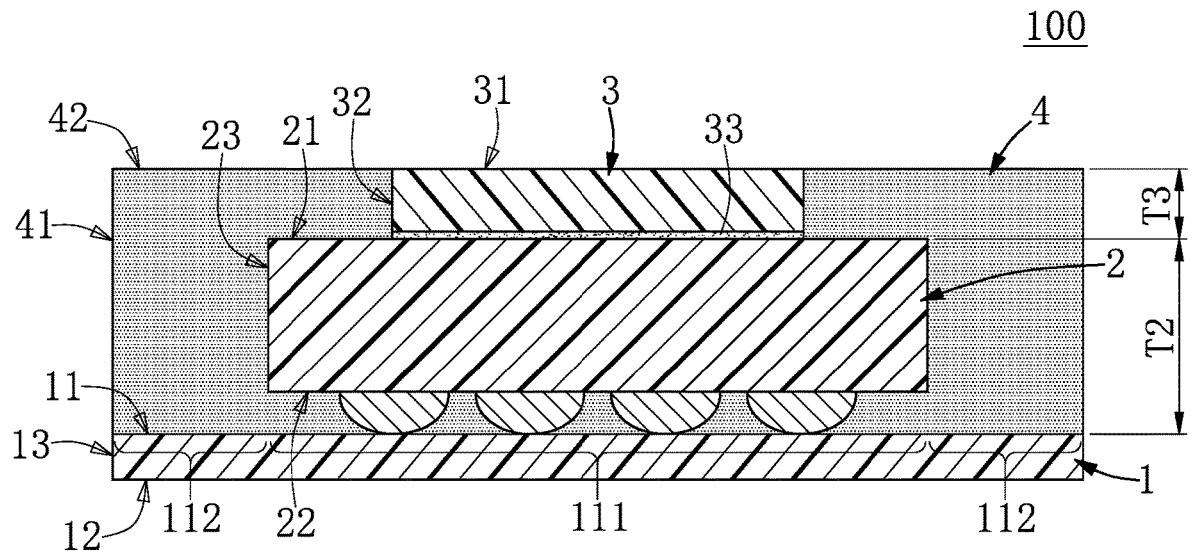
FIG. 2 is a cross-sectional view taken along line II-II of FIG. 1.
Figure 3:
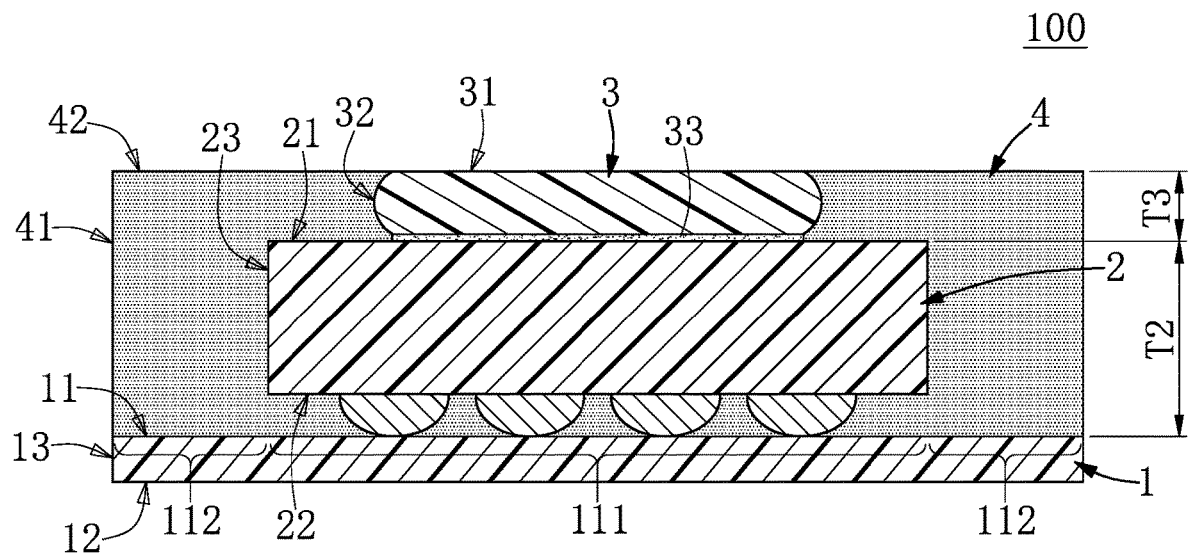
FIG. 3 is a cross-sectional view showing the chip scale package structure in another configuration according to the first embodiment of the present disclosure.

Referring to FIG. 1 to FIG. 3, a first embodiment of the present disclosure provides a chip scale package (CSP) structure 100 with heat-dissipating type that excludes any package structure not formed in a CSP mode. The CSP structure 100 includes a board 1, a die 2 fixed on and electrically coupled to the board 1, a thermally conductive adhesive sheet 3 adhered to the die 2, and a package body 4 that is formed on the board 1. The CSP structure 100 in the present embodiment includes the above components, but the CSP structure 100 can be adjusted or changed according to design requirements.

It should be noted that the drawings of the present embodiment are cross-sectional views for the sake of easily describing the CSP structure 100 of the present embodiment, and portions of the CSP structure 100 not shown in the drawings can be formed according to the cross-sectional views. For example, FIG. 2 shows only four of the solder balls of the die 2, but portions of the CSP structure 100 not shown in FIG. 2 include other solder balls of the die 2. The following description discloses the structure and connection relationship of each component of the CSP structure 100.

The board 1 in the present embodiment is in a square shape or a rectangular shape, but the present disclosure is not limited thereto. The board 1 has a first board surface 11, a second board surface 12 opposite to the first board surface 11, and a surrounding lateral side 13 that is connected to (and located between) the first board surface 11 and the second board surface 12. The first board surface 11 of the board 1 has a fixing region 111 arranged at a substantial center portion thereof and a ring-shaped carrying region 112 that is arranged outside of the fixing region 111.

In addition, in other embodiments of the present disclosure, the board 1 can be provided with a plurality of solder balls (or a plurality of solder contacts) on the second board surface 12, and the CSP structure 100 can be soldered onto an electronic component through the solder balls (or the solder contacts) for electrically coupling to the electronic component.

The die 2 in the present embodiment is a communication die, but the present disclosure is not limited thereto. The die 2 includes a heat-output surface 21 arranged away from the board 1, a bottom side 22 opposite to the heat-output surface 21 (and including a plurality of solder balls), and a surrounding lateral surface 23 that is connected to (and located between) the heat-output surface 21 and the bottom side 22.

Moreover, the bottom side 22 of the die 2 is fixed onto the board 1 in a non-wiring manner (e.g., a surface mounting manner or a flip-chip manner). In other words, any die connected to a board in a wiring manner is different from the die 2 of the present embodiment.

The thermally conductive adhesive sheet 3 in the present embodiment is a non-transparent and solid colloid having silicone and glass fibers. A thickness T3 of the thermally conductive adhesive sheet 3 is preferably smaller than a thickness T2 of the die 2, and the thickness T3 of the thermally conductive adhesive sheet 3 in the present embodiment is within a range of 0.15 to 0.23 mm, but the present disclosure is not limited thereto. Moreover, a thermal conductivity of the thermally conductive adhesive sheet 3 is at least 150% of a thermal conductivity of the package body 4, and is also larger than a thermal conductivity of the heat-output surface 21. The thermal conductivity of the thermally conductive adhesive sheet 3 in the present embodiment is larger than 1 W/mK, but the present disclosure is not limited thereto.

Specifically, the thermally conductive adhesive sheet 3 is gaplessly adhered to the heat-output surface 21 of the die 2, and is connected to at least 50% of an area of the heat-output surface 21. In other words, a peripheral portion of the heat-output surface 21 of the die 2 in the present embodiment is not in contact with the thermally conductive adhesive sheet 3. In the present embodiment, the connection between the thermally conductive adhesive sheet 3 and the die 2 can be established by the following manner. The thermally conductive adhesive sheet 3 has an adhesive layer 33 adhered to the heat-output surface 21, and an adhesion of the adhesive layer 33 is able to maintain at least 8 hours under 180° C., so that when the CSP structure 100 is manufactured or in operation, the adhesive layer 33 is able to maintain the connection between the thermally conductive adhesive sheet 3 and the die 2.

Specifically, the shape of the thermally conductive adhesive sheet 3 in the present embodiment is a square or a rectangle, but can be adjusted or changed according to design requirements (e.g., a circle or an irregular shape). The thermally conductive adhesive sheet 3 has a heat-dissipating surface 31 arranged away from the die 2 and a surrounding lateral surface 32 that is connected to a peripheral edge of the heat-dissipating surface 31. Moreover, an area of the heat-dissipating surface 31 of the thermally conductive adhesive sheet 3 is preferably equal to at least 50% of the area of the heat-output surface 21 connected to the thermally conductive adhesive sheet 3, but the present disclosure is not limited thereto.

The package body 4 is formed on the first board surface 11 of the board 1, and is connected to the carrying region 112 and a portion of the fixing region 111. In other words, the package body 4 is not in contact with the other portion of the fixing region 111. The package body 4 covers and is connected to the die 2 and the entirety of the surrounding lateral surface 32 of the thermally conductive adhesive sheet 3, and a surrounding lateral side 41 of the package body 4 is flush with the surrounding lateral side 13 of the board 1. In the present embodiment, the package body 4 covers and is connected to the surrounding lateral surface 23, the bottom side 22, and the peripheral portion of the heat-output surface 21 of the die 2.

Specifically, the die 2 is embedded in the board 1, the thermally conductive adhesive sheet 3, and the package body 4. In other words, the heat-output surface 21 of the die 2 and the package body 4 jointly define an accommodating slot (not labeled), and the thermally conductive adhesive sheet 3 is filled fully in the accommodating slot and is gaplessly connected to inner walls of the accommodating slot.

Moreover, the heat-dissipating surface 31 of the thermally conductive adhesive sheet 3 is exposed from the package body 4, and the heat-dissipating surface 31 in the present embodiment is configured to be exposed to air or is configured to be connected to a heat-dissipating component (e.g., a heat-dissipating paste, a heat-dissipating metal sheet, a heat-dissipating fin, or a heat-dissipating fan).

Accordingly, any heat energy generated from the die 2 can be directly transmitted to the thermally conductive adhesive sheet 3 by using the thermally conductive adhesive sheet 3 to adhere to the heat-output surface 21 of the die 2, so that the heat-dissipating efficiency of the CSP structure 100 can be effectively increased, and the heat-dissipating configuration of the CSP structure 100 can be different from that of the conventional CSP structure.

In the present embodiment, the package body 4 has a top side 42 arranged away from the board 1. The heat-dissipating surface 31 of the thermally conductive adhesive sheet 3 is a flat surface and is coplanar with the top side 42 of the package body 4, but the present disclosure is not limited thereto. For example, in other embodiments of the present disclosure, the heat-dissipating surface 31 of the thermally conductive adhesive sheet 3 can be a non-flat surface, and can be slightly higher than or slightly lower than the top side 42 of the package body 4.

Moreover, the package body 4 is gaplessly connected to the entirety of the surrounding lateral surface 32 of the thermally conductive adhesive sheet 3, thereby preventing an external moisture from seeping into the CSP structure 100 along a connection boundary between the package body 4 and the thermally conductive adhesive sheet 3. The surrounding lateral surface 32 of the thermally conductive adhesive sheet 3 can be in a flat shape shown in FIG. 2 or an arced shape shown in FIG. 3 that has a center of curvature located in the thermally conductive adhesive sheet 3 for increasing the connection effect between the package body 4 and the thermally conductive adhesive sheet 3.

In the present embodiment, the package body 4 is not connected to the heat-dissipating surface 31 of the thermally conductive adhesive sheet 3, so that the thermally conductive adhesive sheet 3 can have a larger heat-dissipating area, but the present disclosure is not limited thereto. For example, in other embodiments of the present disclosure, the package body 4 can cover or be connected to a peripheral portion of the heat-dissipating surface 31, thereby firmly fixing the thermally conductive adhesive sheet 3.

In addition, the package body 4 in the present embodiment is a molding compound, but the present disclosure is not limited thereto. For example, in other embodiments of the present disclosure, the package body 4 can be a solidified liquid compound, or can include a solidified liquid compound and a molding compound that is formed on the solidified liquid compound.

It should be noted that the thermally conductive adhesive sheet 3 in the CSP structure 100 is adhered to the die 2, so that the thermally conductive adhesive sheet 3 and the package body 4 can be used to jointly encapsulate the die 2 after being solidified. Accordingly, the thermally conductive adhesive sheet 3 cannot be replaced by other thermally conductive components (e.g., a thermally conductive metal).

Second Embodiment

Figure 4:
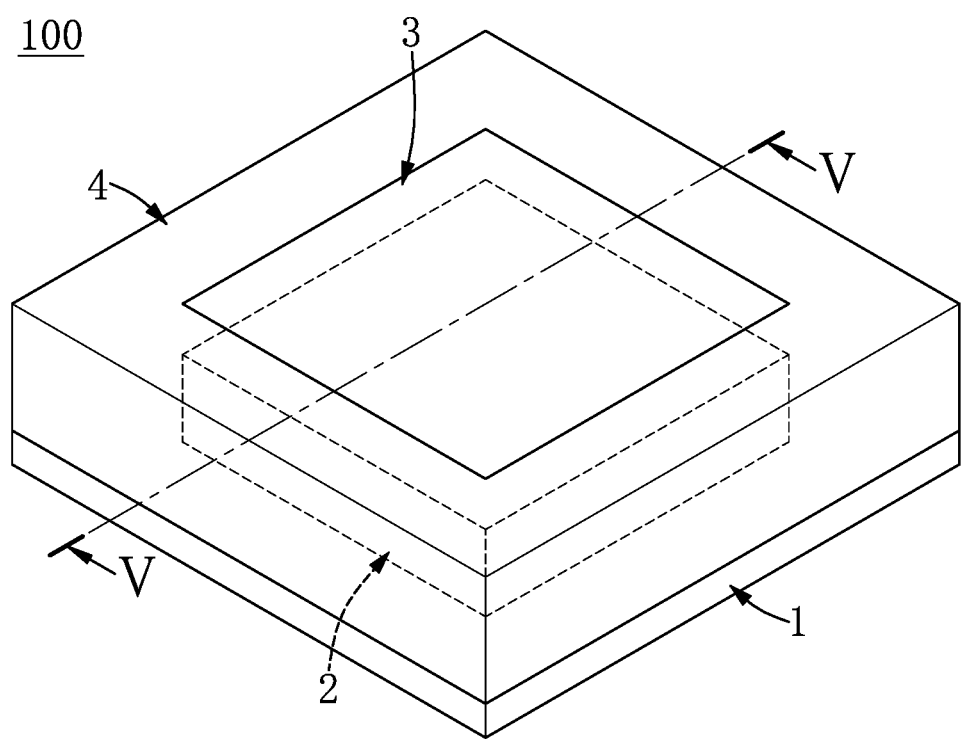
FIG. 4 is a perspective view of a chip scale package structure with heat-dissipating type according to a second embodiment of the present disclosure.
Figure 5:
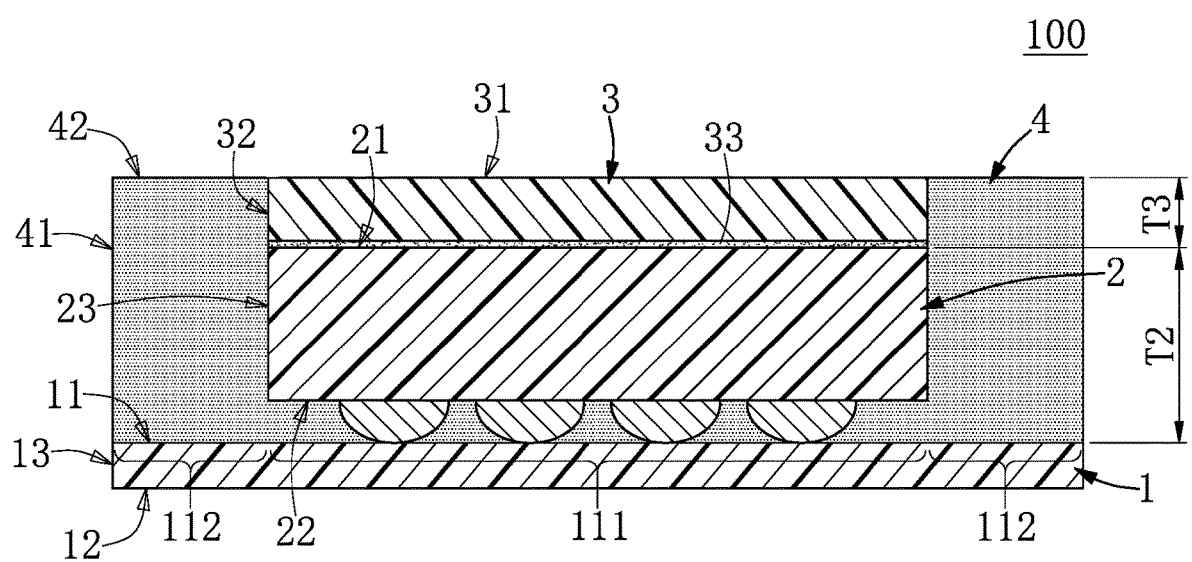
FIG. 5 is a cross-sectional view taken along line V-V of FIG. 4.

Referring to FIG. 4 and FIG. 5, a second embodiment of the present disclosure is similar to the first embodiment of the present disclosure. For the sake of brevity, descriptions of the same components in the first and second embodiments of the present disclosure will be omitted herein, and the following description only discloses different features between the first and second embodiments. The different features reside in the connection relationship between the thermally conductive adhesive sheet 3 and the die 2.

Specifically, the thermally conductive adhesive sheet 3 in the present embodiment is connected to the entire heat-output surface 21, and the surrounding lateral surface 32 of the thermally conductive adhesive sheet 3 is flush with the surrounding lateral surface 23 of the die 2. In other words, the shape of the thermally conductive adhesive sheet 3 corresponds to that of the heat-output surface 21, but the present disclosure is not limited thereto. For example, in other embodiments of the present disclosure, the thermally conductive adhesive sheet 3 can further extend to cover at least part of the surrounding lateral surface 23 of the die 2, thereby increasing the heat-dissipating efficiency of the die 2.

Moreover, the surrounding lateral surface 32 of the thermally conductive adhesive sheet 3 in the present embodiment can be in a flat shape, but the present disclosure is not limited thereto. For example, in other embodiments of the present disclosure, the surrounding lateral surface 32 of the thermally conductive adhesive sheet 3 can be in an arced shape that has a center of curvature located in the thermally conductive adhesive sheet 3, thereby increasing the connection effect between the package body 4 and the thermally conductive adhesive sheet 3.

In conclusion, any heat energy generated from the die of the present disclosure can be directly transmitted to the thermally conductive adhesive sheet by using the thermally conductive adhesive sheet to adhere to the heat-output surface of the die, so that the heat-dissipating efficiency of the CSP structure of the present disclosure can be effectively increased, and the heat-dissipating configuration of the CSP structure of the present disclosure can be different from that of the conventional CSP structure.

Moreover, the CSP structure of the present disclosure can be provided by implementing at least one specific feature (e.g., the thickness of the thermally conductive adhesive sheet being within a range of 0.15 to 0.23 mm; the thermal conductivity of the thermally conductive adhesive sheet being larger than 1 W/mK; the heat-dissipating surface of the thermally conductive adhesive sheet being coplanar with the top side of the package body; an area of the heat-dissipating surface of the thermally conductive adhesive sheet being equal to at least 50% of the area of the heat-output surface connected to the thermally conductive adhesive sheet; an adhesion of the adhesive layer being able to be maintained for at least 8 hours under 180° C.; or the package body being gaplessly connected to the entirety of the surrounding lateral surface of the thermally conductive adhesive sheet) for effectively increasing the heat-dissipating efficiency and the producing efficiency of the CSP structure.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A chip scale package structure of a heat-dissipating type, comprising:
   a board;
   a die fixed on and electrically coupled to the board, wherein the die has a heat-output surface arranged away from the board;
   a thermally conductive adhesive sheet, being a non-transparent and solid colloid having silicone and glass fibers, wherein the thermally conductive adhesive sheet is adhered to the heat-output surface of the die through an adhesive layer thereof and is connected to at least 50% of an area of the heat-output surface, and wherein the thermally conductive adhesive sheet has a heat-dissipating surface arranged away from the die and a surrounding lateral surface that is connected to a peripheral edge of the heat-dissipating surface; and a package body formed on the board, wherein the package body covers and is connected to the die and an entirety of the surrounding lateral surface of the thermally conductive adhesive sheet, wherein the die is encapsulated in the package body, and wherein the heat-dissipating surface of the thermally conductive adhesive sheet is coplanar and flush with a top side of the package body and is configured to be exposed to air, and a thermal conductivity of the thermally conductive adhesive sheet is at least 150% of a thermal conductivity of the package body, wherein the package body is connected to the entirety of the surrounding lateral surface of the thermally conductive adhesive sheet, and the surrounding lateral surface of the thermally conductive adhesive sheet is in an arced shape that has a center of curvature located in the thermally conductive adhesive sheet.

2. The chip scale package structure according to claim 1, wherein a thickness of the thermally conductive adhesive sheet is smaller than a thickness of the die, and the thickness of the thermally conductive adhesive sheet is within a range of 0.15 to 0.23 mm.

3. The chip scale package structure according to claim 1, wherein the thermal conductivity of the thermally conductive adhesive sheet is larger than a thermal conductivity of the heat-output surface, and the thermal conductivity of the thermally conductive adhesive sheet is larger than 1 W/mK.

4. The chip scale package structure according to claim 1, wherein the thermally conductive adhesive sheet is connected to an entirety of the heat-output surface, and the surrounding lateral surface of the thermally conductive adhesive sheet is flush with a surrounding lateral surface of the die.

5. The chip scale package structure according to claim 1, wherein the package body is a molding compound.

6. The chip scale package structure according to claim 1, wherein an area of the heat-dissipating surface of the thermally conductive adhesive sheet is equal to at least 50% of the area of the heat-output surface connected to the thermally conductive adhesive sheet.

7. The chip scale package structure according to claim 1, wherein an adhesion of the adhesive layer is able to be maintained for at least 8 hours under a temperature of 180° C.

8. The chip scale package structure according to claim 1, wherein the package body is not connected to the heat-dissipating surface of the thermally conductive adhesive sheet.

9. The chip scale package structure according to claim 1, wherein a surrounding lateral side of the package body is flush with a surrounding lateral side of the board.

10. A chip scale package structure of a heat-dissipating type, comprising:
a board;
a die fixed on and electrically coupled to the board, wherein the die has a heat-output surface arranged away from the board;
a thermally conductive adhesive sheet, being a non-transparent and solid colloid having silicone and glass fibers, wherein the thermally conductive adhesive sheet is adhered to the heat-output surface of the die through an adhesive layer thereof and is connected to at least 50% of an area of the heat-output surface, and wherein the thermally conductive adhesive sheet has a heat-dissipating surface arranged away from the die and a surrounding lateral surface that is connected to a peripheral edge of the heat-dissipating surface; and
a package body formed on the board, wherein the package body covers and is connected to the die and an entirety of the surrounding lateral surface of the thermally conductive adhesive sheet,
wherein the die is encapsulated in the package body, and wherein the heat-dissipating surface of the thermally conductive adhesive sheet is exposed from the package body and is configured to be exposed to air, and a thermal conductivity of the thermally conductive adhesive sheet is at least 150% of a thermal conductivity of the package body,
wherein the package body is connected to the entirety of the surrounding lateral surface of the thermally conductive adhesive sheet, and the surrounding lateral surface of the thermally conductive adhesive sheet is in an arced shape that has a center of curvature located in the thermally conductive adhesive sheet.

\* \* \* \* \*